US011373024B1

United States Patent
Goyal et al.

(10) Patent No.: US 11,373,024 B1
(45) Date of Patent: Jun. 28, 2022

(54) CIRCUIT SIMULATION BASED ON A HIGH-LEVEL LANGUAGE CIRCUIT SPECIFICATION

(71) Applicant: Xilinx, Inc., San Jose, CA (US)

(72) Inventors: Sahil Goyal, Hyderbad (IN); Hongbin Zheng, San Jose, CA (US); Mahesh Attarde, Maharashtra (IN); Amit Kasat, Hyderabad (IN)

(73) Assignee: XILINX, INC., San Jose, CA (US)

( * ) Notice: Subject to any disclaimer, the term of this patent is extended or adjusted under 35 U.S.C. 154(b) by 616 days.

(21) Appl. No.: 16/353,981

(22) Filed: Mar. 14, 2019

(51) Int. Cl.
*G06F 30/33* (2020.01)
*G06F 30/331* (2020.01)

(52) U.S. Cl.
CPC ............ *G06F 30/33* (2020.01); *G06F 30/331* (2020.01)

(58) Field of Classification Search
CPC ........ G06F 30/20; G06F 30/33; G06F 30/367; G06F 30/30; G06F 30/327
See application file for complete search history.

(56) References Cited

PUBLICATIONS

Chi et al. Rapid Cycle-Accurate Simulator for High Level Synthesis FPGA '19, Feb. 24-26, 2019 (Year: 2019).*
Coussy et al. An Introduction to High-Level Synthesis IEEE Design & Test of Computers, 2009 (Year: 2009).*
Boolean Algebra and Reduction Techniques Jan. 2013 (Year: 2013).*

* cited by examiner

*Primary Examiner* — Rehana Perveen
*Assistant Examiner* — Cuong V Luu
(74) *Attorney, Agent, or Firm* — Crawford Maunu PLLC (57) ABSTRACT

The disclosed approaches involve executing simulator-parallel processes that correspond to states of a finite state machine representation of a circuit design. Execution of each simulator-parallel process is initiated in response to an event generated by another one of the simulator-parallel processes. A data access transaction of the circuit design is simulated by calling a first function of a wrapper from a first process of the simulator-parallel processes. The first process waits for an estimated number of simulation clock cycles. The estimated number of simulation clock cycles represents an actual time period required to complete an actual data access transaction.

17 Claims, 5 Drawing Sheets

FIG. 5

CIRCUIT SIMULATION BASED ON A HIGH-LEVEL LANGUAGE CIRCUIT SPECIFICATION

TECHNICAL FIELD

The disclosure generally relates to simulation of circuitry based on a high-level language specification.

BACKGROUND

High-level synthesis is a process by which a high-level language (HLL) specification is translated into a register transfer language (RTL) specification. HLLs are languages that have been historically used to create software programs that can be compiled into program code that is executable by a computer processor. The RTL specification generated from an HLL specification can be processed into implementation data, which can then be used to configure a programmable integrated circuit (IC) or fabricate an application-specific integrated circuit (ASIC). Thus, high-level synthesis supports creating a circuit from an HLL specification, can expedite the process of creating circuit designs, and allow designers having a wider range of technical backgrounds to create circuit designs.

Simulation is an important part of the design flow for implementing a circuit from a circuit design. Simulating operation of a circuit based on a circuit design is critical to verify the function of the circuit as well as performance. However, simulation can require a significant amount of the designer's time as well as a significant amount of computer resources. A simulation model based on the RTL specification of the circuit design can include a finite state machine, which has a state for each signal in the circuit design. Transitions between states are in response to simulation events, and each active state generates an event with each simulation clock cycle. With vast gate counts in present day circuit designs, simulation can require a significant amount of computer resources and time.

SUMMARY

A disclosed method includes executing on a computer system, simulator-parallel processes that correspond to states of a finite state machine representation of a circuit design. The method initiates execution of each simulator-parallel process of the simulator-parallel processes in response to an event generated by another one of the simulator-parallel processes. A data access transaction of the circuit design is simulated in the method by calling a first function of a wrapper from a first process of the simulator-parallel processes, and waiting by the first process for an estimated number of simulation clock cycles. The estimated number of simulation clock cycles represents an actual time period required to complete an actual data access transaction.

A disclosed system includes a processor and a memory arrangement coupled to the processor. The memory arrangement is configured with instructions that when executed cause the processor to execute simulator-parallel processes that correspond to states of a finite state machine representation of a circuit design. In executing the instructions, the processor initiates execution of each simulator-parallel process in response to an event generated by another one of the simulator-parallel processes. The processor simulates a data access transaction of the circuit design in executing the instructions by calling a first function of a wrapper from a first process of the simulator-parallel processes and making the first process wait for an estimated number of simulation clock cycles. The estimated number of simulation clock cycles represents an actual time period required to complete an actual data access transaction.

Other features will be recognized from consideration of the Detailed Description and Claims, which follow.

BRIEF DESCRIPTION OF THE DRAWINGS

Various aspects and features of the disclosed methods and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed approaches improve computer performance while executing circuit simulations by significantly reducing the number of events generated during simulation. The approaches approximate cycle-accurate simulation. The approaches employ a transaction-level model, which is generated by a transaction-level model compiler. The transaction-level model compiler creates the transaction-level model based on an intermediate format specification of a finite state machine and an operation schedule. The intermediate format specification is generated by an HLS frontend tool, and an HLS scheduler generates the operation schedule for the states of the finite state machine. Thus, the transaction-level model is not based on an RTL specification of the design.

The transaction-level model has processes that correspond to the states of the finite state machine, and each process performs operations of the corresponding state. One type of process performs compute operations of the HLL specification, and another type of process performs operations specific to a particular transaction model, such as memory access operations.

The transaction-level model further includes an interface wrapper and in an exemplary application a memory bus interface. Though the disclosed approaches are described in terms of a memory bus transaction protocol, the interface wrapper can be configured to communicate via other transaction protocols such as AXI streams, first-in-first-out (FIFO) buffers, block RAMs (BRAMs). The interface wrapper handles data access transactions initiated by the processes, and the exemplary memory interface simulates a memory bus protocol. The transaction-level model compiler identifies data access transactions in the intermediate format specification and specifies callbacks to functions of the interface wrapper in the processes of the transaction-level model. In an application involving a memory bus, for example, the data access transactions include memory load and memory store transactions. The interface wrapper thereby alleviates the processes of the transaction-level model from having to handle protocol-specific communications. For example, the processes of the of the transaction-level model are not required to perform any handshaking with a memory bus interface simulation. The functions of the interface wrapper handle any necessary handshaking and control.

Computer system performance is improved by way of significantly reducing the number of events generated during simulation. The number of events generated within a state and the number of events that trigger transitions between states of the simulated finite state machine re reduced. Whereas circuit simulation based on an RTL specification generates events with each simulation clock cycle, the transaction-level model generates only a single event after completion of the transaction.

Cycle-accurate timing is approximated by delaying generation of an event signaling completion of a transaction for a number of simulation clock cycles corresponding to an approximation of the latency involved in an actual transaction.

Figure 1:
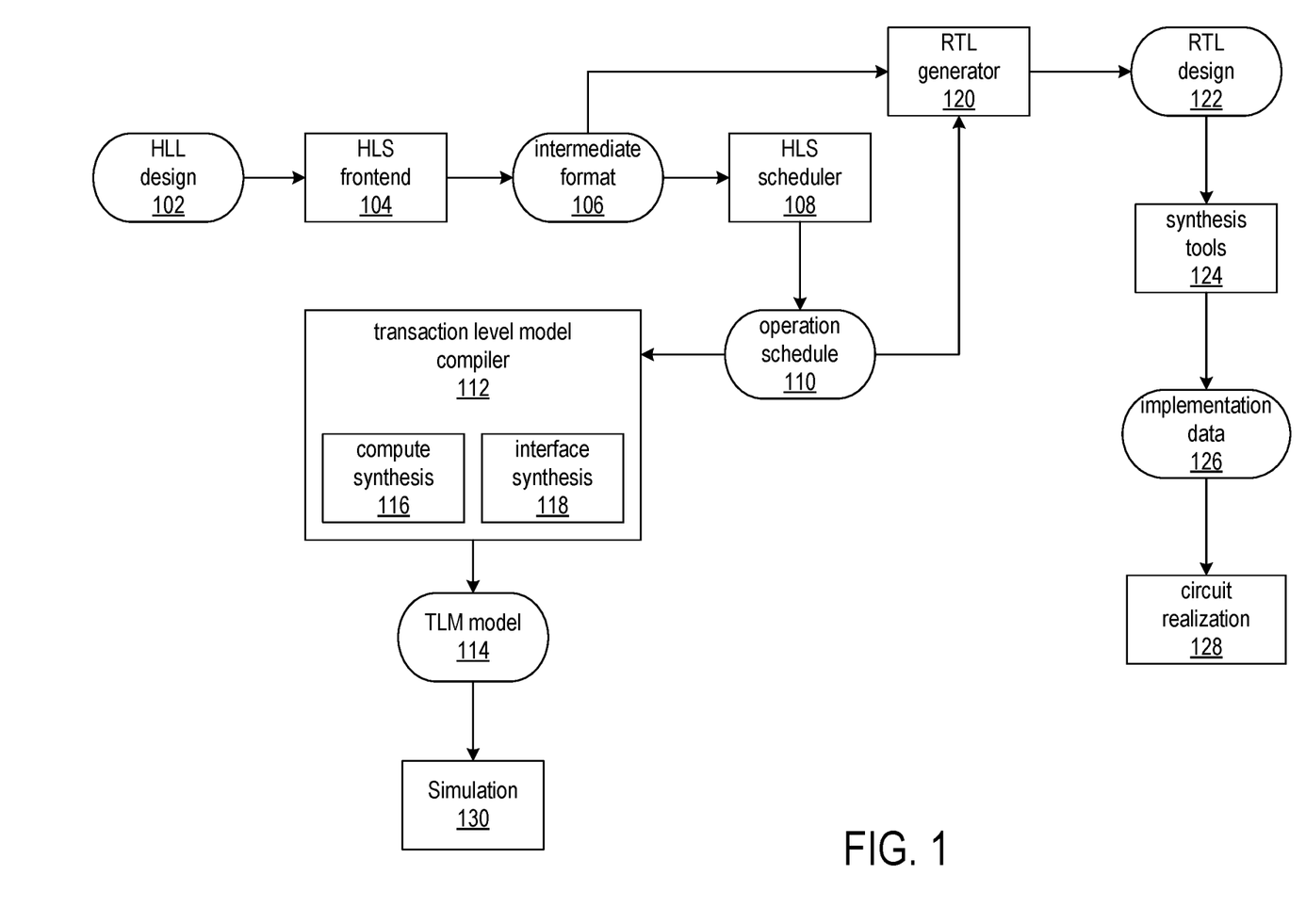
FIG. 1 shows a process and data flow for generating a transaction-level model (TLM) for simulation of a circuit based on an HLL design, along with a process and data flow for generating implementation data for making an circuit from the HLL design.

FIG. 1 shows a process and data flow for generating a transaction-level model for simulation of a circuit based on an HLL design, along with a process and data flow for generating implementation data for making a circuit from the HLL design.

The HLL design 102 is input to the HLS frontend process 104. The HLS frontend process generates an intermediate format specification 106 of a finite state machine. In generating the intermediate format specification 106, the HLS frontend process 104 captures and specifies computational aspects and aspects of data access transactions implicated by the HLL design.

The HLS scheduler process 108 inputs the intermediate format specification 106 and generates an operation schedule 110, which specifies an order and simulated duration of operations associated with the finite state machine specified in the intermediate format specification. The HLS scheduler 108 further groups the operations according to the resources involved and timing constraints.

The transaction-level compiler 112 uses the operation schedule 110 to generate the transaction-level model 114. The transaction-level compiler includes a compute synthesis function 116 and an interface synthesis function 118. The transaction-level model includes processes that correspond to the states of the finite state machine described by the intermediate format specification 106. A circuit simulation 130 can be run using the transaction-level model 114.

The compute synthesis function 116 of the transaction level compiler 112 performs a breadth-first search of all states of the finite state machine (FSM) specified in the operation schedule 110. The states of the FSM have an associated list of operations to be executed on register values in the cycle represented by the state. To synthesize a state, a list of operations is extracted from the state and the operations are converted to executable program code to be executed by the simulation 130.

The interface synthesis function 118 captures interface information in the operation schedule 110 as intrinsic operations and iterates over the operations to determine the type of interface and the configuration requested for the interface.

Following a successful simulation, the design flow can continue to a realization 128 of a circuit based on HLL design 102.

The RTL generator can prepare an RTL specification 122 based on the intermediate format specification 106 and the operation schedule 110. Synthesis, place-and-route, and technology mapping tools (collectively, "synthesis tools 124") can be used to process the RTL code into implementation data 126. Further configuration or fabrication tools (not shown) can be used to make a circuit by configuring a device having programmable logic or fabricating an application specific integrated circuit (ASIC) based on the implementation data, as depicted by circuit realization 128.

Figure 2:
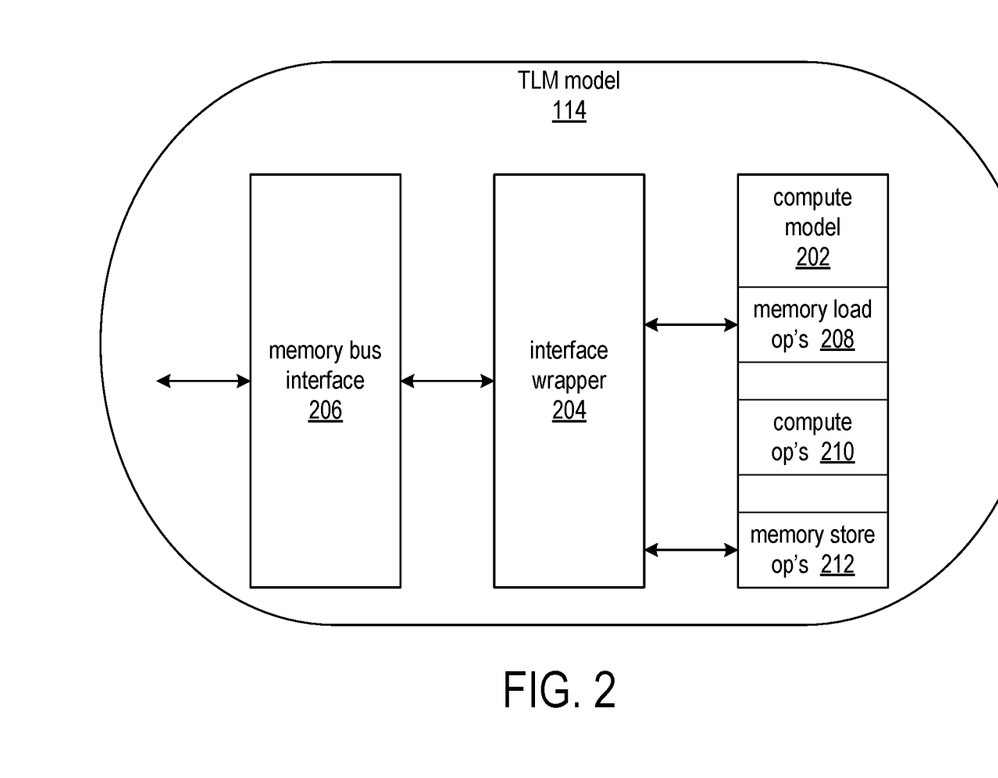
FIG. 2 shows a transaction-level model generated from an HLL specification of a circuit design.

FIG. 2 shows a transaction-level model 114 generated from an HLL specification of an exemplary circuit design. The transaction-level model includes a compute kernel 204, interface wrapper 204, and memory bus interface 206. The compute model 202 includes multiple processes that correspond to the states of a finite state machine that describes hardware functions derived from the HLL specification and control data flow modelling. The processes can be simulation-level parallel processes and in an exemplary implementation in SystemC, can be either an SC_METHOD or an SC_THREAD. Some simulators can be configured to execute multiple threads, and thereby support parallel execution of processes by the host computer system. State transitions are event notifications initiated by the processes such as by an SC_EVENT or through an SC_FIFO.

The processes of the compute model 202 specify compute operations and memory access operations. The compute operations are shown as block 210, and the memory access operations include load and store operations, which can be also be referred to as read and write. The memory load operations are shown as block 208, and the memory store operations are shown as block 212. Each compute operation is implemented as an instruction(s) that manipulates data currently within the scope of the process. The memory load and memory store operations access data in a memory over memory bus. Though not shown, it will be recognized that the compute model can specify data access transactions through other interfaces, such as a streaming interface, a FIFO buffer interface or a BRAM interface. Data access operations through the different interfaces would be specified in the compute model 202 as separate blocks.

The interface wrapper 204 includes callback functions that are invoked by the memory load operations 208 and memory store operations 212 specified in the compute model 202. The callback functions call functions of the memory bus interface 206. The functions of memory bus interface 206 simulate a particular memory bus protocol. The interface wrapper 204 insulates the memory load operations 208 and memory store operations 212 initiated from the compute model 202 from the details involved in interacting with the memory bus protocol of the memory bus interface 206. The interface wrapper 204 can include different callback functions that call functions of interfaces that implement transaction protocols different from the memory bus interface 206.

The interface wrapper 204 eliminates the signals and events that would be involved in an RTL simulation of the accesses to the memory over the memory bus interface 206. Though the interface wrapper 204 and memory bus interface 206 mimic handshaking involved in the memory interface protocol, no simulation events are involved between the interface wrapper and the memory interface. Instead, the memory load/store operation can issue a single completion event after the memory access is complete and after waiting for a suitable period of simulation time.

The following example illustrates the transformation of an HLL specification into a transaction-level model. Example 1 shows exemplary HLL program code.

```
#pragma HLS INTERFACE m_axi port=image1 offset=slave bundle=gmem0
#pragma HLS INTERFACE m_axi port=image2 offset=slave bundle=gmem0
#pragma HLS INTERFACE s_axilite port=image1 bundle=s_axi
#pragma HLS INTERFACE s_axilite port=image2 bundle=s_axi
#define X_SIZE 512
#define Y_SIZE 512
#define ALPHA 0.5f
_kernel_attribute_((reqd_work_group_size(1,1,1)))
void affine_kernel(_global unsigned short*image1,
    global unsigned short*image2
    )
{
    for (int x=0; x<X_SIZE; x++){
        for (int y=0; y<Y_SIZE; y++){
            int index=x*X_SIZE+y;
            image2 [index]=ALPHA*image1 [index]+
                ALPHA*image1 [index];
        }
    }
}
```

Example 1

The HLL frontend 104 (FIG. 1) generates an intermediate format specification of a finite state machine from the HLL specification. The intermediate format specification defines states, state transitions, operations associated with the states. The operations include functional instructions for computations and interface information for memory accesses. The #pragma statements in the HLL specification in Example 1 indicate an AXI interface and a particular configuration to the HLL frontend.

Example 2 shows an example having a subset of the states of a finite state machine specified in an intermediate format.

```
*FSM state transitions:
1→
    2/true
. . .
2→
    167/(exitcond flatten)
    137/(!exitcond flatten)
137→
    138/true
. . .
```

Example 2

The exemplary states are states 1, 2, and 137. Other states are not shown as the complete set of states and transitions is unnecessary for purposes of this explanation. A state transition is specified by a predicate that indicates the condition that triggers the transition to the next state. For example, the transition from state 2 to state 167 is triggered in response to exit_cond_flatten being true. The predicate "true" indicates that the transition happens unconditionally upon completion of the operations associated with the state.

The HLL scheduler 108 (FIG. 1) creates an operation schedule 110 from the states, state transitions, operations associated with the states of the intermediate format specification. Example 3 shows the operations associated with a subset of the states of the finite state machine shown in Example 1, along with the schedule of operations generated by the HLL scheduler. The scheduled operations specify the resources and time sharing of resources of the finite state machine.

```
*FSM state operations:
<State 1>: 1.00 ns
ST_1:Op [1/1]→"% image2 read=call i64 @_ssdm_o-
    p_Read.s_axilite.i64(i64% image2) nounwind"→ . . . "
ST_1:Op [1/1]→"% image1 read=call i64 @_ssdm_o-
    p_Read.s_axilite.i64(i64% image1) nounwind"→ . . . "
ST_1:Op [1/1]→"% tmp_3=call i58
    @_ssdm_op_PartSelect.i58.i64.i32.i32" (i64% image1
    read, i32 6, i32 63)"
ST_1:Op [1/1]→"% tmp_6=call i58
    @_ssdm_op_PartSelect.i58.i64.i32.i32 (i64% image2
    read, i32 6, i32 63)"
<State 2>: 2.43 ns
ST_2:0p [1/1]→"% tmp=sext i58% tmp_3 to i64"
ST_2:0p [1/1]→"% gmem_addr=getelementptr i512 addr-
    space(1)*% gmem, i64% tmp"
ST_2:0p [134/134]→"% p_req=call i1 @_ssdm_o-
    p_ReadReq.m_axi.pli512 (i512 addrspace(1)*% gme-
    m_addr, i32 8192) . . . "
<State 3>: 2.43 ns
ST_3:0p [133/134]→"% p_req=call it @_ssdm_o-
    p_ReadReq.m_axi.pli512 (i12 addrspace91)*% gme-
    m_addr, iew 8192) . . . "
<State 4>: 2.43 ns
ST_4:0p [133/134]→"% p_req=call it @_ssdm_o-
    p_ReadReq.m_axi.pli512 (i12 addrspace91)*% gme-
    m_addr, iew 8192) . . . "
<State 135>: 2.43 ns
ST_135:Op [1/134]→"% p_req=call i1
    @_ssdm_op_readReq.m_axis.pli512 . . . "
ST_135:Op [1/1]→"% tmp_1=sext i58% tmp_6 to i64"
ST_135:Op [1/1]→"% gmem_addr 1=getelementptr i512
    addrspace(1)*% gmem, i64% tmp_1"
ST_135:Op [1/1]→"% p reg1=call i1 @_ssdm_op_Writ-
    eReq.m_axi.pli512 ( . . . )"
ST_135:Op [1/1]→"br label %.split3"
```

Example 3

Operations in the form "call . . . @_ssdm_op_. . . " are memory load/store operations. The operations within a state can run in parallel, except for truncate or bit concatenate operations. Each state has an associated time value that indicates the approximate amount of time consumed in performing the operations of the state by the implemented circuit. For example, state 1 has a time value 1.00 ns, and state 3 has a time value of 2.43 ns. The associated time values are used by the transaction-level compiler to determine the number of simulation clock cycles consumed by the operations in each state.

The transaction-level model compiler 112 (FIG. 1) generates a transaction-level model 114 from the operation schedule 110. Continuing with the examples presented above, Example 4 shows a portion of the transaction-level model generated from the exemplary operation schedule of Example 3.

```
void XHT_dense::dense_state_1( ) {
   wait(clk_period);
   dense_image2 read=ssdm_axilite_read (dense_image2);
   dense_image1 read=ssdm_axilite_read (dense_image1);
   dense_tmp_3=dense_image1_read;
   dense_tmp_6=dense_image2_read;
   dense_t_1_2.notify(SC_ZERO_TIME);
}
void XHT_dense::dense_state_2_135( ){
   dense_tmp=dense_tmp_3;
   dense_gmem_addr=dense_gmem+dense_tmp;
   hls_xtlm_maxi_gmem_rdreq_post(dense_gmem_addr, 8192);
   wait (clk_period*134);
   dense_tmp_1=dense_tmp_6;
   dense_gmem_addr_1=dense_gmem+dense_tmp_1;
   hls_xtlm_maxi_gmem_wrreq_post(dense_gmem_addr_1,8192);
   dense_indvar_flatten_next=1;
   dense_t_135_136.notify (SC_ZERO_TIME);
}
```

Example 4

The states in the transaction-level model behave as parallel processes. As implemented in System C, each state can be either an SC_METHOD or an SC_THREAD. State transitions are event notifications with SC_EVENT or SC_FIFO.

A state in the transaction-level model consumes a minimum of one simulation clock cycle. To provide cycle-accurate simulation, each process in the transaction-level model calls a wait function to wait for one or more simulation clock cycles.

The transaction-level compiler generates state 1 as the process "dense_state_1." The transition from state 1 to state 2 is compiled into the function "dense_t_1_2." At the end of state 1, an event notification is sent to state 2 to start execution in the next simulation clock cycle. The SC_ZERO_TIME parameter in the event notification denotes a delay of 0 simulation clock cycles. In the call to the notify function, the parameter instructs the simulator to process the event in the next simulation clock cycle. Thus, the operations of state_2_135 will be triggered in the next simulation clock cycle in response to state_1 raising the event notification in the current simulation clock cycle. Other values can be passed of the notify function to delay triggering the operations of the next state by a specified number of simulation clock cycles.

Memory transactions can span multiple simulation clock cycles and across multiple states of the finite state machine. For memory transactions that span multiple states, the transaction-level model compiler combines the operations of the multiple states into a single process and specifies a call to a wait function that suspends execution of further operations of the process by a number of simulation clock cycles corresponding to an approximated latency the provided by the HLS scheduler. For example, the call to wrapper interface function "hls_xtlm_maxi_gmem_*" spans over state 2 to state 135, and the transaction-level compiler creates "dense_state_2_135". Combining the states reduces the number of events generated for state transitions. The transaction-level model compiler inserts a call to a wait function after the call to the function of the interface wrapper, and the parameter provided to the wait function indicates the number of simulation clock cycles to wait (clk_period*134).

The interface wrapper 204 and memory bus interface 206 can be implemented according to the particular protocol. For example, the interface wrapper has two different callback functions for read requests and three different callback functions for write requests in an AXI-based wrapper interface. One of the read callback functions processes read-post requests (non-blocking) and the other read callback function processes read-get requests (blocking). For write transactions, a first callback function processes write-post requests (non-blocking), a second callback function processes non-posted-write requests (blocking), and a third callback function processes write responses.

The callback functions of the interface wrapper 204 communicate with the functions of the memory bus interface 206 through first-in-first-out (FIFO) buffers. Memory read requests are stored by the interface wrapper in one FIFO buffer, and the memory bus interface reads and processes requests from the FIFO buffer. Data from read requests is returned from the memory bus interface to the interface wrapper through another FIFO buffer. Blocking and non-blocking functionality for read transactions can be implemented with SystemC FIFO buffers.

The compute model 202 initiates write transactions through the write request, write data, and write response callback functions of the interface wrapper 204. The interface wrapper queues write address requests to a FIFO buffer, which the memory bus interface 206 reads from. A subsequent call to the write data callback function by the compute model 202 queues the address and data to be written in a separate write FIFO buffer. The interface wrapper waits for write responses from the memory bus interface. Each different protocol interface has a separate FIFO buffer to queue write responses. The compute model invokes the wrapper interface to read a write response from the response FIFO buffer to complete a write transaction. Blocking and non-blocking functionality for write transactions can be implemented with SystemC FIFO buffers.

Figure 3:
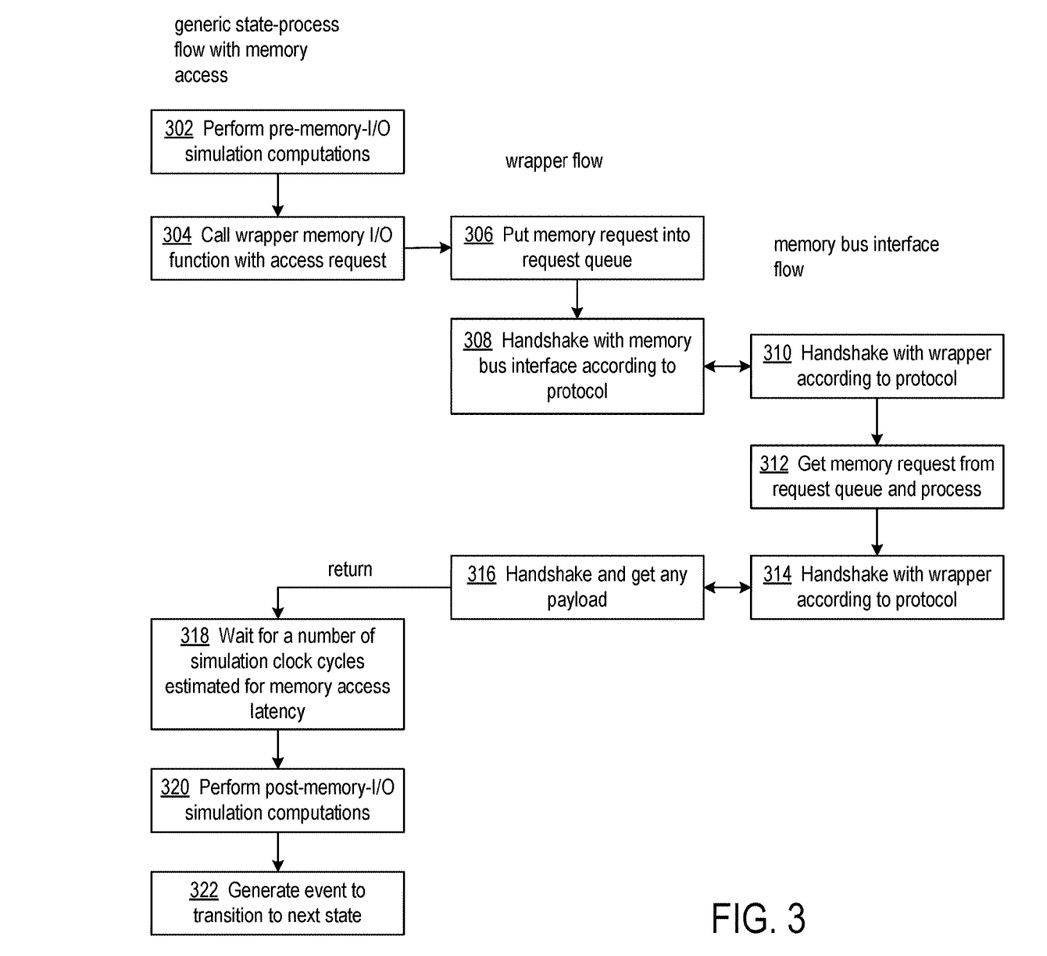
FIG. 3 shows a flowchart of an exemplary simulation process involving a transaction-level model, an interface wrapper, and a memory bus interface.

FIG. 3 shows a flowchart of an exemplary simulation process involving a transaction-level model, an interface wrapper, and a memory bus interface. Though the exemplary simulation process involves a memory bus interface, a similar process can be performed for other data access transaction protocols. At block 302, a process (which implements a state of a finite state machine) of the transaction-level model performs any specified operations prior to initiating a memory transaction (or "I/O" for short). At block 304, the transaction-level model process calls a function of the interface wrapper to initiate a memory transaction. The interface wrapper at block 306 puts the request in a FIFO buffer, and at block 308 performs any requisite handshake functions with the memory bus interface according to the memory bus protocol. At block 310, the memory bus interface performs the handshake functions with the interface wrapper, and at block 312, the memory bus interface gets the memory access request from the FIFO buffer and processes the request. Data and responses can be returned by the memory bus interface through a FIFO buffer.

At block 314, the memory bus interface performs any needed handshake functions with the interface wrapper to signal completion of processing the request. At block 316, the interface wrapper executes any necessary handshake functions with the memory bus interface, retrieves the payload or response from the FIFO buffer, and returns control to the calling process of the transaction-level model.

At block 318, the calling process of the transaction-level model initiates a wait function with simulator delay a transition to the next state by the number simulation clock cycles estimated to complete the access request initiated at block 304. At block 320, the process of the transaction-level model performs any specified operations called for after completion of the memory access. The process generates an event at block 322 to signal a transition to the next state.

Various aspects of the disclosed approaches contribute to the improved performance of a computer system simulating operation of a circuit. In one aspect, memory bus communications are encapsulated by wrapper interface, allowing for a reduction in the number of signals simulated and a reduction in the number of simulation events.

The compute model 202 (FIG. 2) represents functional components of the design at a higher level of abstraction than would an RTL simulation model. In an RTL simulation model, each register is part of simulation. The transaction-level model uses HLL variables (e.g., C++) to represent data elements, which reduces simulation events as compared to the RTL simulation model. The use of C++ types instead of protoSystemC types reduces the number of events within compute states.

The disclosed approaches reduce the number of simulation events by eliminating components that simulate waiting. For example, to simulate 50 cycles of no-operations in an RTL model, a digital counter is sometimes used to count the 50 cycles, and an event is generated in each of the 50 cycles. In the present approach, a wait function simulates the waiting, and only a single event is generated upon return from the wait function.

In another aspect, consecutive states that transition based on an always-true predicate are combined into a single process. By combining the multiple states into a single process, no event is needed to transition from one state to the next state in the single process. In addition, combining states reduces the number of simulation processes to be managed by the simulator.

Figure 4:
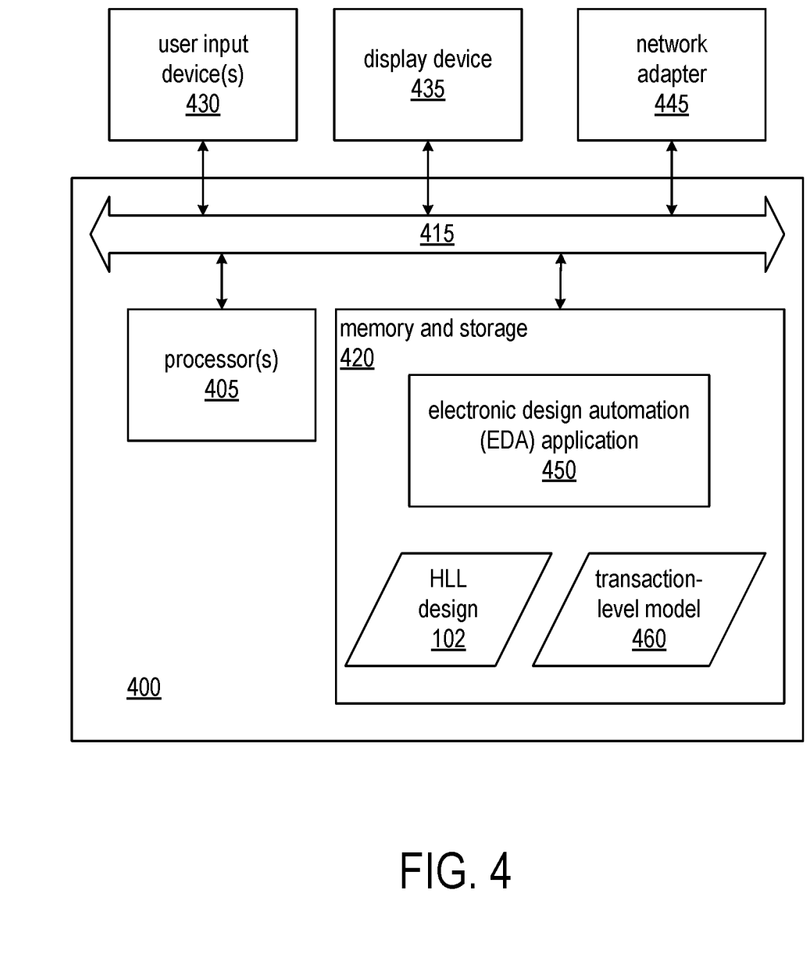
FIG. 4 is a block diagram illustrating an exemplary data processing system that host an electronic design automation (EDA) application.

FIG. 4 is a block diagram illustrating an exemplary data processing system (system) 400 that host an electronic design automation (EDA) application. As pictured, system 400 includes at least one processor circuit (or "processor"), e.g., a central processing unit (CPU) 405 coupled to memory and storage arrangement 420 through a system bus 415 or other suitable circuitry. System 400 stores program code and circuit design 100 within memory and storage arrangement 420. Processor 405 executes the program code accessed from the memory and storage arrangement 420 via system bus 415. In one aspect, system 400 is implemented as a computer or other data processing system that is suitable for storing and/or executing program code. It should be appreciated, however, that system 400 can be implemented in the form of any system including a processor and memory that is capable of performing the functions described within this disclosure.

Memory and storage arrangement 420 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 400 may also include one or more cache memories (not shown) that provide temporary storage of at least some program code and data in order to reduce the number of times program code and data must be retrieved from local memory and persistent storage during execution.

Input/output (I/O) devices such as user input device(s) 430 and a display device 435 may be optionally coupled to system 400. The I/O devices may be coupled to system 400 either directly or through intervening I/O controllers. A network adapter 445 also can be coupled to system 400 in order to couple system 400 to other systems, computer systems, remote printers, and/or remote storage devices through intervening private or public networks. Modems, cable modems, Ethernet cards, and wireless transceivers are examples of different types of network adapter 445 that can be used with system 400.

Memory and storage arrangement 420 may store an EDA application 450. EDA application 450, being implemented in the form of executable program code, is executed by processor(s) 405. As such, EDA application 450 is considered part of system 400. System 400, while executing EDA application 450, receives and operates on the HLL circuit design 102. In one aspect, system 400 performs a design flow on circuit design 100, and the design flow may include synthesis, mapping, placement, routing, and the generation of circuit implementation data. In addition, the EDA application includes a transaction-level model compiler that generates a transaction-level model 460 as described herein.

EDA application 450, HLL circuit design 102, transaction-level model 460, and any data items used, generated, and/or operated upon by EDA application 450 are functional data structures that impart functionality when employed as part of system 400 or when such elements, including derivations and/or modifications thereof, are loaded into an IC such as a programmable IC causing implementation and/or configuration of a circuit design within the programmable IC.

Figure 5:
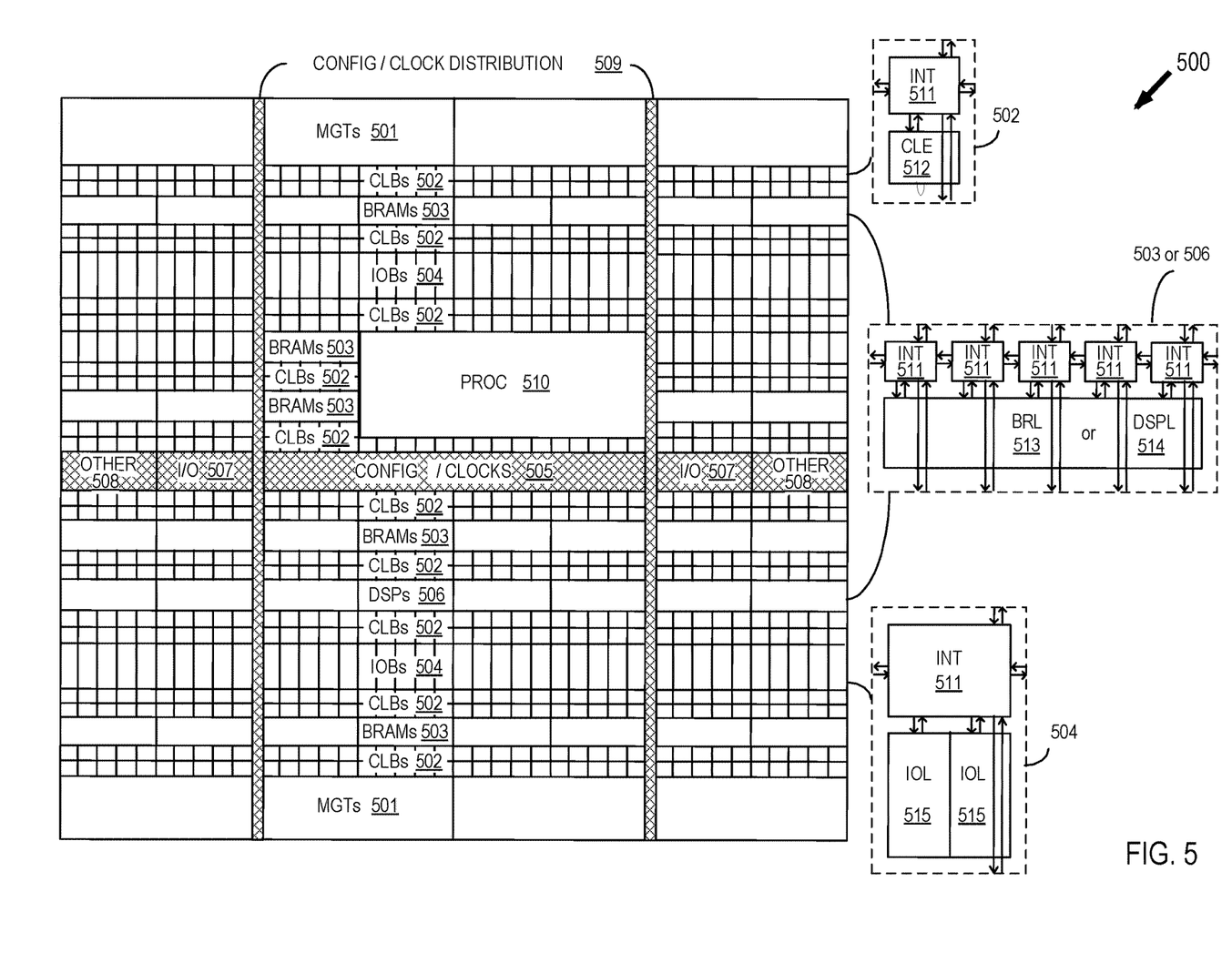
FIG. 5 shows a programmable integrated circuit (IC) on which a circuit can be implemented based on an HLL design.

FIG. 5 shows a programmable integrated circuit (IC) 500 on which a circuit can be implemented based on an HLL design. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

A columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for simulating a circuit based on an HLL design. Other aspects and features will be apparent to those skilled in the art from consideration of the specification. It is intended that the specification and drawings be considered as examples only, with a true scope of the invention being indicated by the following claims.

What is claimed is:

1. A method comprising:
   executing on a computer system, simulator-parallel processes that correspond to states of a finite state machine representation of a circuit design;
   initiating execution of each simulator-parallel process of the simulator-parallel processes in response to an event generated by another one of the simulator-parallel processes; and
   simulating a data access transaction of the circuit design by:
     calling from a first process of the simulator-parallel processes, a first function of a wrapper that performs the data access transaction over a plurality of simulation clock cycles and states without generating events for state changes of the finite state machine during the transaction;
     waiting by the first process for an estimated number of simulation clock cycles, the estimated number of simulation clock cycles representing an actual time period required to complete an actual data access transaction; and
     generating a single simulation event by the first process after waiting for the estimated number of simulation clock cycles.

2. The method of claim 1, further comprising waiting for at least one simulation clock cycle by each process of the simulator-parallel processes.

3. The method of claim 1, wherein the simulating the data access transaction includes simulating the data access transaction made over a memory bus.

4. The method of claim 3, wherein the simulating the data access transaction includes providing the data access transaction from the first function of the wrapper to a bus interface simulator.

5. The method of claim 4, wherein the providing the data access transaction from the first function of the wrapper to the bus interface simulator includes storing the transaction in a first first-in-first-out (FIFO) buffer that is accessible to the bus interface simulator.

6. The method of claim 5, wherein the simulating the data access transaction includes communicating payload data through a second FIFO buffer.

7. The method of claim 4, wherein the simulating the data access transaction includes performing protocol-specific communications by the first function of the wrapper with the bus interface simulator.

8. The method of claim 1, further comprising:
   synthesizing the circuit design into implementation data; and
   making a circuit from the implementation data.

9. The method of claim 1, further comprising:
   representing data elements of the circuit design with variables of a high-level language; and
   compiling the variables into elements of the simulator-parallel processes.

10. The method of claim 9, further comprising combining sequential states of the finite state machine representation that transition on an always-true predicate into a single one of the simulator-parallel processes.

11. The method of claim 9, wherein the compiling includes generating a transaction-level model based on an intermediate format specification of a finite state machine and an operation schedule for states of the finite state machine of the circuit design.

12. The method of claim 11, wherein the compiling includes:
   identifying data access transactions in the intermediate format specification; and
   specifying callbacks in processes of a compute model to functions of an interface wrapper.

13. A system comprising:
a processor;
a memory arrangement coupled to the processor and configured with instructions that when executed cause the processor to perform operations including:
executing simulator-parallel processes that correspond to states of a finite state machine representation of a circuit design;
initiating execution of each simulator-parallel process of the simulator-parallel processes in response to an event generated by another one of the simulator-parallel processes; and
simulating a data access transaction of the circuit design by:
  calling from a first process of the simulator-parallel processes, a first function of a wrapper that performs the data access transaction over a plurality of simulation clock cycles and states without generating events for state changes of the finite state machine during the transaction;
  waiting by the first process for an estimated number of simulation clock cycles, the estimated number of simulation clock cycles representing an actual time period required to complete an actual data access transaction; and
  generating a single simulation event by the first process after waiting for the estimated number of simulation clock cycles.

14. The system of claim 13, wherein the memory arrangement is further configured with instructions that when executed cause the processor to wait for at least one simulation clock cycle by each process of the simulator-parallel processes.

15. The system of claim 13, wherein the instructions for simulating the data access transaction include instructions that when executed cause the processor to simulate the data access transaction made over a memory bus.

16. The system of claim 15, wherein the instructions for simulating the data access transaction include instructions that when executed cause the processor to provide the data access transaction from the first function of the wrapper to a bus interface simulator.

17. The system of claim 16, wherein:
the instructions for simulating the data access transaction include instructions that when executed cause the processor to perform protocol-specific communications by the first function of the wrapper with the bus interface simulator; and
the instructions for simulating include instructions that when executed cause the processor to generate one simulation event in response to returning from calling the first function of the wrapper.

\* \* \* \* \*